United States Patent
Beechem, III et al.

(10) Patent No.: US 10,418,304 B2
(45) Date of Patent: Sep. 17, 2019

(54) ION-IMPLANTED THERMAL BARRIER

(71) Applicants: National Technology & Engineering Solutions of Sandia, LLC, Albuquerque, NM (US); University of Virginia Patent Foundation, Charlottesville, VA (US)

(72) Inventors: Thomas Edwin Beechem, III, Albuquerque, NM (US); Khalid Mikhiel Hattar, Albuquerque, NM (US); Jon Ihlefeld, Charlottesville, VA (US); Edward S. Piekos, Albuquerque, NM (US); Douglas L. Medlin, San Ramon, CA (US); Luke Yates, Altanta, GA (US); Patrick E. Hopkins, Charlottesville, VA (US)

(73) Assignees: National Technology & Engineering Solutions of Sandia, LLC, Albuquerque, NM (US); University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 16/107,470

(22) Filed: Aug. 21, 2018

(65) Prior Publication Data
US 2019/0139856 A1  May 9, 2019

Related U.S. Application Data

(60) Provisional application No. 62/550,772, filed on Aug. 28, 2017.

(51) Int. Cl.
*H01L 23/34* (2006.01)
*H01L 23/373* (2006.01)
*H01L 21/265* (2006.01)

(52) U.S. Cl.
CPC .......... *H01L 23/373* (2013.01); *H01L 21/265* (2013.01); *H01L 23/34* (2013.01)

(58) Field of Classification Search
CPC ...... H01L 21/365; H01L 23/373; H01L 23/34
USPC ........................................... 257/713
See application file for complete search history.

(56) References Cited

U.S. PATENT DOCUMENTS 7,135,747 B2 * 11/2006 Allen .................. H01L 29/0649
257/401

\* cited by examiner

*Primary Examiner* — Luan C Thai
(74) *Attorney, Agent, or Firm* — Kevin W. Bieg

(57) ABSTRACT

Ion implantation can be used to define a thermal dissipation path that allows for better thermal isolation between devices in close proximity on a microelectronics chip, thus providing a means for higher device density combined with better performance.

8 Claims, 6 Drawing Sheets

ION-IMPLANTED THERMAL BARRIER

CROSS-REFERENCE TO RELATED APPLICATION

This application claims the benefit of U.S. Provisional Application No. 62/550,772, filed Aug. 28, 2017, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to thermal conduction in microelectronic devices and, in particular, to thermal isolation of a cold device from a hot source via ion-implanted thermal barriers in microelectronic devices.

BACKGROUND OF THE INVENTION

As microelectronic components continue to shrink, the heat fluxes associated with their use have exponentially increased. Consequently, it is not uncommon for microelectronics to reach temperatures higher than 150° C. Such high temperatures can negatively impact device performance and also limit those types of devices or components that can be placed in close proximity to the heat-generating device on a microelectronic chip. For certain applications, it is therefore not only necessary to dissipate the heat but to do so in a way in which the thermal path does not affect other nearby devices.

SUMMARY OF THE INVENTION

The present invention is directed an ion-implanted thermal barrier, comprising an ion-implanted region between a hot device and a cool device on a substrate. The barrier can be used to define a thermal dissipation path that will allow for better thermal isolation between devices in close proximity, thus providing a means for higher device density combined with better performance.

BRIEF DESCRIPTION OF THE DRAWINGS

The detailed description will refer to the following drawings, wherein like elements are referred to by like numbers.

DETAILED DESCRIPTION OF THE INVENTION

Ion implantation is a frequently utilized tool in the microelectronics industry for the doping of semiconductors. A scalable technology, standard lithographic approaches allow the implant to take on arbitrary shapes and patterns. Beyond doping, implantation can deposit virtually any element into another material. Further, ion implantation provides a controlled means to introduce strain and assorted defects in a lattice. In general, ion irradiating solids leads to a decrease in thermal conductivity due to increased electron and phonon scattering from defect sites. From a thermal perspective, these characteristics can be leveraged to "draw" a thermal circuit that defines the path that heat decays away from an operating component. Specifically, the present invention is directed to a method by which ion implantation is utilized to create thermally resistive barriers of arbitrary shape.

Figure 1:
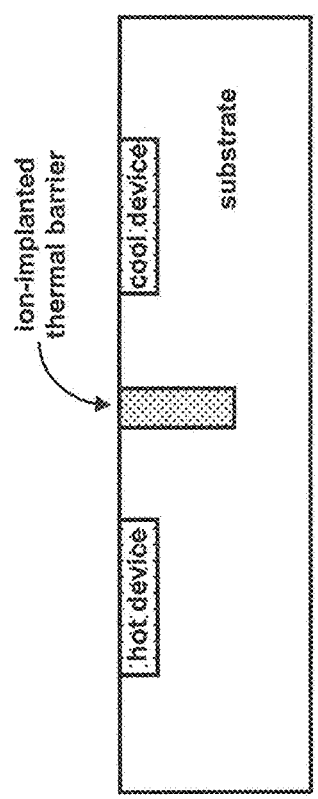
FIG. 1 is a schematic illustration of an ion-implanted thermal barrier to provide thermal isolation of a cool device from a hot device.

As shown in FIG. 1, the ion-implanted thermal barrier can "fence" the thermal environment of a hot device from a cool device, enabling better thermal isolation of the devices. The implanted ion is preferably a noble gas ion, but can be any other element that can be implanted. The distribution of defects resulting from ion irradiation is dictated by the ion beam energy and the ion dose. The latter determines the magnitude of ion concentration inside the material while the former determines the depth at which this concentration is maximum. Both parameters influence the level of the induced damage. The decrease in thermal conductivity is directly related to the increase in defect concentration due to the increase in irradiation dose. Typically, the implant dose can be greater than $1 \times 10^{15}/cm^2$, although other doses can be used, depending on the implant ion and substrate. As the ion beam energy is increased, the defected region moves deeper into the material, leading to a reduced defect concentration near the surface region. Depending on the energy of the ion, the ion can be implanted at any depth necessary for thermal isolation in a two- or three-dimensional device design. The substrate can typically be any substrate that is used in microelectronics, such as silicon, SiC, diamond, GaN, or GaAs. In addition to providing a thermal barrier between hot and cold devices on a planar substrate, ion implantation can be used to thermally separate hybridized chips in three-dimensional architectures. Ion implantation can also be used to fence the diffusion of species resulting from thermal gradients.

Solid bubbles of noble gases implanted in metals have been studied for several decades, primarily due to problems caused by He in fission and fusion reactor materials. Structural investigations have shown that these bubbles are crystalline, with a large difference between the lattice parameter of the host gas and the host matrix. For Kr in an Al matrix, this difference can be as much as 30%. Thus, misfit dislocations and significant strain in the host metal lattice are present near the interface. See G. L. Zhang and L. Niesen, *Hyperfine Interactions* 53(1-4), 253 (1990). The large lattice mismatch, combined with the defects and strain at the interface, make it likely that noble gas inclusions in a metal will create a significant barrier to thermal transport.

Figure 2B:
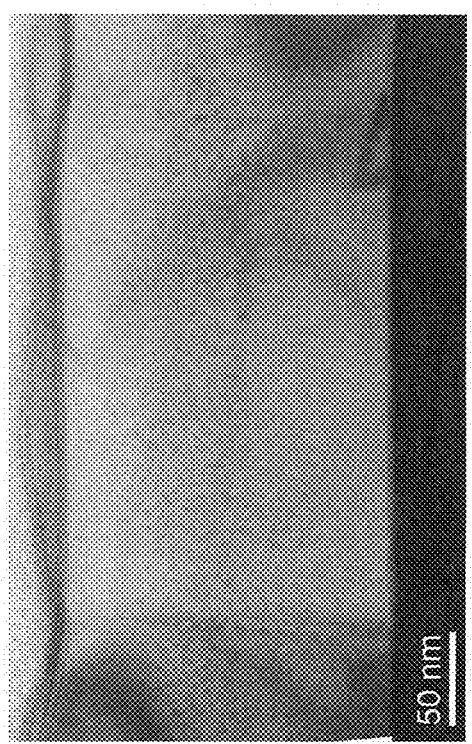
FIG. 2(b) is a TEM image of an aluminum film subjected to xenon ion irradiation. The films were imaged in an "overfocus" condition to enhance phase contrast.
Figure 2A:
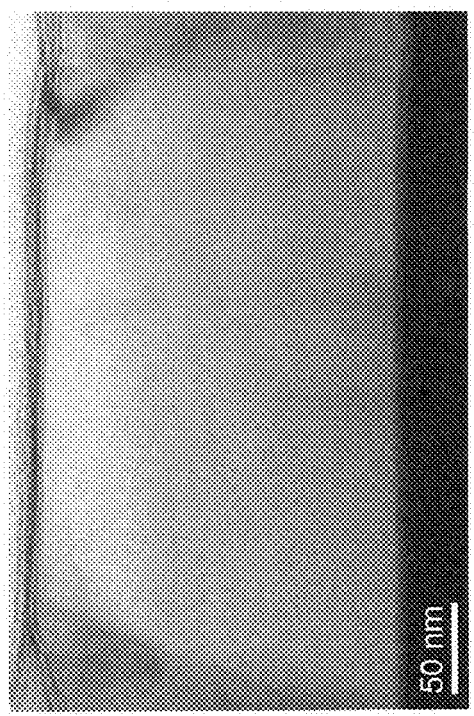
FIG. 2(a) is a transmission electron microscopy (TEM) image of an aluminum film.
Figure 3:
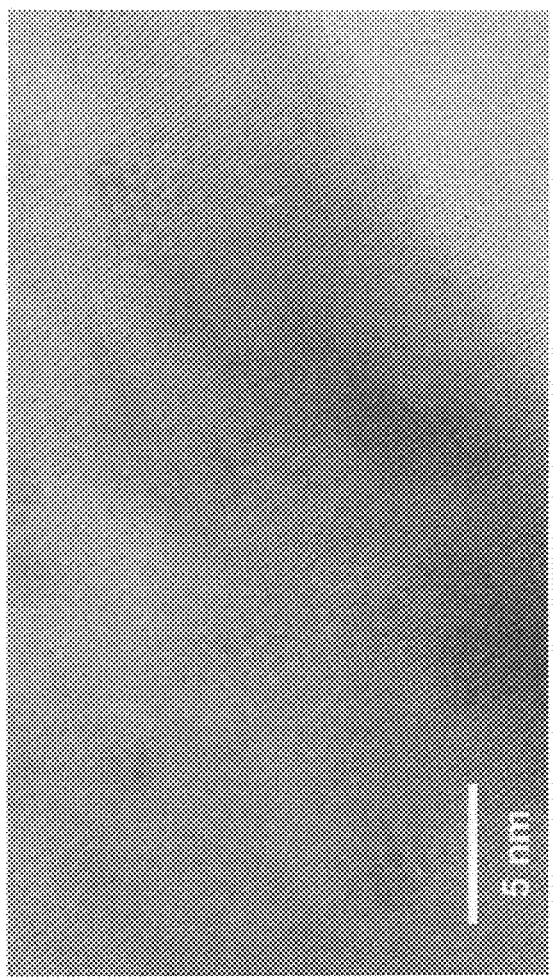
FIG. 3 is a high-resolution TEM image of an ion-implanted region, showing likely Xe bubbles.
Figure 4:
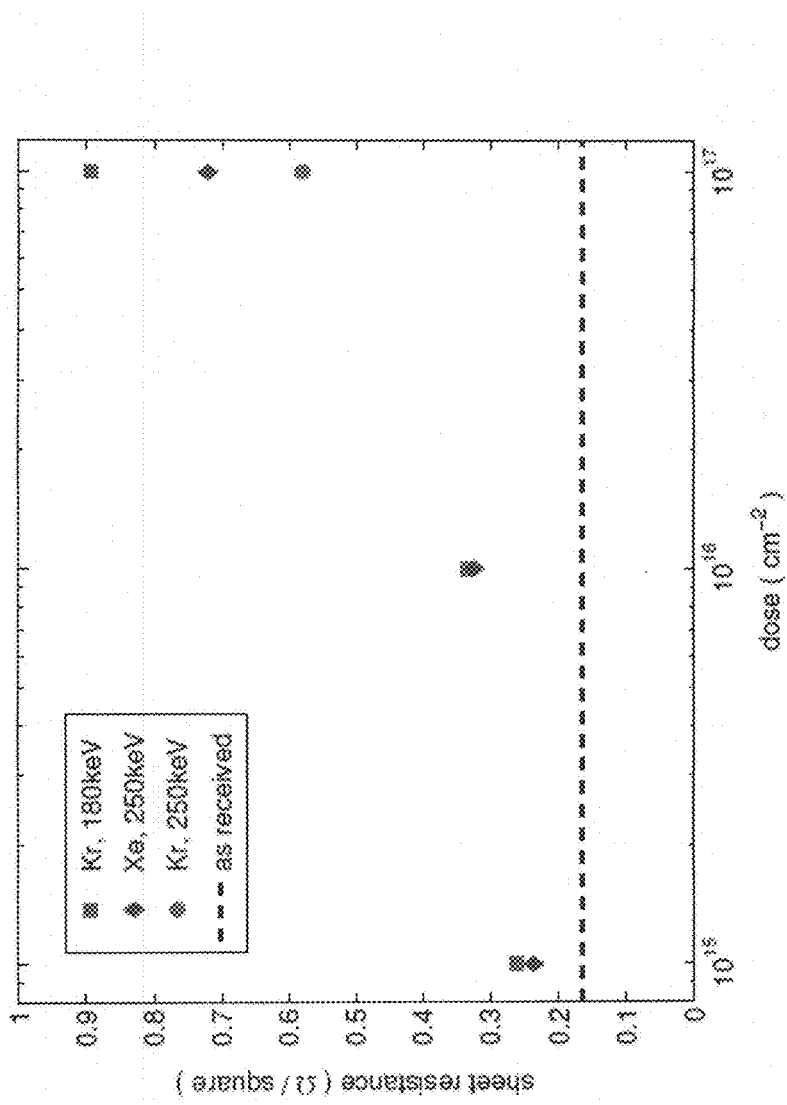
FIG. 4 is a graph of the sheet resistance of ion-implanted aluminum films as a function of implant dose.

As examples of the invention, Xe and Kr were implanted into aluminum films at two different energies and a range of doses. Transmission electron microscopy (TEM) images of a control film and its irradiated counterpart are shown in FIGS. 2(a) and 2(b), respectively. A high-resolution TEM image showing what is likely the solid Xe is shown in FIG. 3. In both cases the implant energy was 250 keV and the dose was $1\times10^{16}$ ions/cm$^2$. The resulting sheet resistance, which gives an indication of the thermal conductivity for a metal from the Wiedmann-Franz law, is shown in FIG. 4. As expected, the resistivity increases with dose. It may be further observed that the resistance is weakly tied to the implanted species, particularly at lower doses. The lower sheet resistance for Kr at 250 keV than at 180 keV is likely related to a higher proportion of ions traveling completely through the film at the higher energy, leaving fewer implanted bubbles in the film.

In the present invention, ions are implanted into a substrate to act as a thermal barrier between hot and cold devices. Such a thermal barrier can be useful when components with very different thermal requirements or characteristics must be placed in close proximity. For example, a device designer may want to place an amplifier that tends to generate heat near a sensor that must be kept cool to operate properly. The thermal barrier can be constructed using the ion implantation tools already widely used in the microelectronics industry for doping semiconductors. Therefore, it can be a reasonably inexpensive means for controlling the heat dissipation path. The ion-implanted thermal barrier can have advantages for some applications compared to other types of thermal barriers, such as trenches. For example, the ion-implanted thermal barrier does not break the surface and, therefore, can be done before device fabrication without affecting downstream processes. Alternatively, because it has negligible effect on neighboring devices or components, the ion implantation can be done in post-processing.

Figure 5:
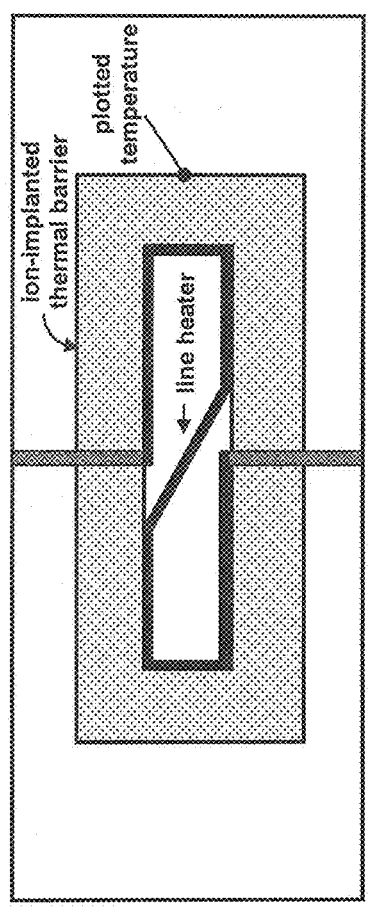
FIG. 5 is a schematic illustration of a 20-micron wide xenon ion-implanted thermal barrier surrounding a resistive line heater on a silicon wafer.
Figure 6:
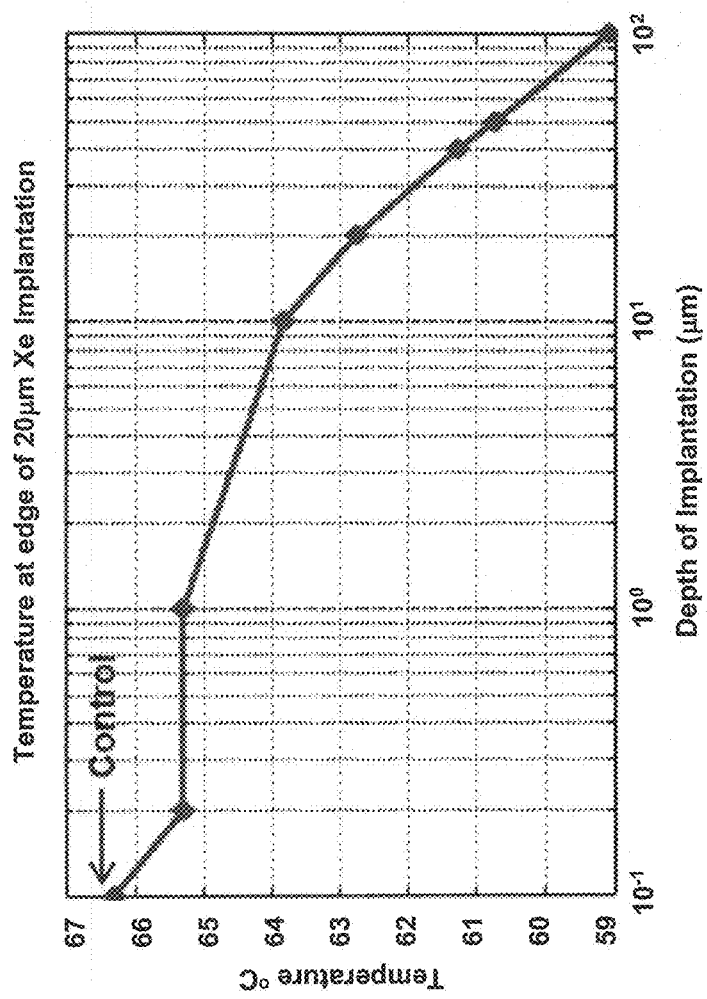
FIG. 6 is a graph of a simulation showing the effect of the implant depth on the temperature just outside the 20-micron wide ion-implanted thermal barrier.

A simulated demonstration of the ion-implanted thermal barrier concept is shown in FIG. 5. In this figure, a 20-micron wide xenon ion-implanted thermal barrier is placed around a heat-producing device (in this case, simply a line heater) fabricated on a silicon wafer. The temperature just outside the thermal barrier was computed via a finite element simulation. In FIG. 6 is shown a graph of the temperature at the edge of the barrier as a function of the depth of implantation. The figure shows that the heated area away from the hot device can be decreased through proper depths and thicknesses of the xenon implant. Other implant ions and material systems can also be used. Therefore, the invention is directed to a general method of utilizing ion implantation to create thermally resistive barriers that act to define a thermal dissipation path on microelectronic chips.

The present invention has been described as an ion-implanted thermal barrier. It will be understood that the above description is merely illustrative of the applications of the principles of the present invention, the scope of which is to be determined by the claims viewed in light of the specification. Other variants and modifications of the invention will be apparent to those of skill in the art.

We claim:

1. An ion-implanted thermal barrier, comprising an ion-implanted region between a hot device and a cool device on a substrate.

2. The ion-implanted thermal barrier of claim 1, wherein the implanted ion comprises a noble gas ion.

3. The ion-implanted thermal barrier of claim 2, wherein the noble gas ion comprises krypton or xenon.

4. The ion-implanted thermal barrier of claim 1, wherein the substrate comprises silicon, silicon carbide, diamond, gallium nitride, or gallium arsenide.

5. The ion-implanted thermal barrier of claim 1, wherein the dose of the ion implant is greater than $1\times10^{15}$ ions/cm$^2$.

6. The ion-implanted thermal barrier of claim 1, wherein the substrate comprises a microelectronic chip.

7. The ion-implanted thermal barrier of claim 1, wherein the range of the implanted ion is less than the thickness of the substrate.

8. The ion-implanted thermal barrier of claim 1, wherein the range of the implanted ion is greater than the depth of the hot device or the cold device in the substrate.

* * * * *